(12) United States Patent
Koshiishi et al.

(10) Patent No.: US 8,063,476 B2
(45) Date of Patent: Nov. 22, 2011

(54) SEMICONDUCTOR DEVICE

(75) Inventors: Kazutaka Koshiishi, Tokyo (JP); Mitsuaki Katagiri, Tokyo (JP); Satoshi Isa, Tokyo (JP); Dai Sasaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 81 days.

(21) Appl. No.: 12/327,649

(22) Filed: Dec. 3, 2008

(65) Prior Publication Data

US 2009/0140409 A1 Jun. 4, 2009

(30) Foreign Application Priority Data

Dec. 4, 2007 (JP) ................................ P2007-313317

(51) Int. Cl.
*H01L 23/02* (2006.01)

(52) U.S. Cl. ......... 257/686; 257/777; 257/784; 438/123

(58) Field of Classification Search .................. 257/686, 257/777, 784, E23.142, E27.144, E27.161; 438/123, 127

See application file for complete search history.

(56) References Cited

U.S. PATENT DOCUMENTS

| 6,445,594 | B1 * | 9/2002 | Nakagawa et al. | 361/776 |
| 2005/0029642 | A1 * | 2/2005 | Takaya et al. | 257/678 |
| 2006/0138631 | A1 * | 6/2006 | Tao et al. | 257/686 |

FOREIGN PATENT DOCUMENTS

| JP | S61-237455 | 10/1986 |
| JP | 2004-259769 | 9/2004 |
| JP | 2005-167160 | 6/2005 |

* cited by examiner

*Primary Examiner* — Theresa T Doan
(74) *Attorney, Agent, or Firm* — McDermott Will & Emery LLP

(57) ABSTRACT

A semiconductor device includes a substrate having bumps on the backside thereof, a first semiconductor chip mounted on the surface of the substrate, a second semiconductor chip mounted on the first semiconductor chip above the surface of the substrate, a first bonding wire having a length $L_1$ for connecting the first semiconductor chip to the substrate, a second bonding wire having a length $L_2$ (where $L_2 > L_1$) for connecting the second semiconductor chip to the substrate, a first resin seal having a dielectric constant $\in_1$ for sealing the first bonding wire, and a second resin seal having a dielectric constant $\in_2$ (where $\in_2 < \in_1$) for sealing the second bonding wire. The relationship between the lengths $L_1$ and $L_2$ and the dielectric constants $\in_1$ and $\in_2$ is defined by an equation of $\in_1 = \in_2 (L_2/L_1)^2$.

7 Claims, 4 Drawing Sheets

(RELATED ART)

SEMICONDUCTOR DEVICE

BACKGROUND OF THE INVENTION

1. Field of the Invention

The present invention relates to semiconductor devices for laminating multiple semiconductor chips in packages.

The present application claims priority on Japanese Patent Application No. 2007-313317, the content of which is incorporated herein by reference.

2. Description of Related Art

Due to recent progresses in high-speed processing, high-density structures, and highly-integrated constitutions, various types of packages of semiconductor devices (hereinafter referred to as laminated packages) have been developed to laminate multiple semiconductor chips therein.

Laminated packages are each designed such that multiple semiconductor chips are vertically laminated together while external input/output terminals thereof are aligned in a single direction, wherein semiconductor chips differ from each other in lengths of wiring with external input/output terminals. This causes differences of delay times applied to signals with respect to semiconductor chips. As signal processing of a semiconductor device speeds up, differences in delay times become apparent due to differences of wiring lengths; hence, it is difficult to speed up signal processing.

One example of the laminated package will be described in conjunction with FIGS. 5A and 5B, which show semiconductor devices 100 and 101 each encapsulated in a double density package (DDP). In each of the semiconductor devices 100 and 101, two semiconductor chips 103 and 104 are sequentially laminated on a single substrate 102 having a plurality of bumps 102a for inputting and outputting signals in connection with an external device (not shown), wherein they are connected to the substrate 102 via bonding wires 105 and 106.

In the semiconductor device 100 shown in FIG. 5A, the bonding wires 105 are wired through an opening 102b of the substrate 102 so as to connect the semiconductor chip 103 to the substrate 102. A resin 107b is formed to seal the substrate 102, the semiconductor chips 103 and 104, and the bonding wires 106 (for connecting the semiconductor chip 104 to the substrate 102). In addition, a resin 107a is formed to seal the opening 102b of the substrate 102 and the bonding wires 105. Both the resins 107a and 107b are composed of the same resin material. The bonding wires 106 are longer than the bonding wires 105.

In the semiconductor device 101 shown in FIG. 5B, both the bonding wires 105 and 106 are arranged above a surface 102c of the substrate 102.

Each of the semiconductor devices 100 and 101 is produced in such a way that the "first" semiconductor chip 103 is connected to the substrate 102 via the bonding wires 105; the "second" semiconductor chip 104 is laminated on the semiconductor chip 103; and then, the semiconductor chip 104 is connected to the substrate 102 via the bonding wires 106. Herein, the bonding wires 105 and 106 having different lengths are used to connect the semiconductor chips 103 and 104 to the substrate 102 in each of the semiconductor devices 100 and 101. This causes differences between delay times (applied to signals transmitted between the semiconductor chip 103 and the external input/output bumps 102a) and delay times (applied to signals transmitted between the semiconductor chip 104 and the external input/output bumps 102a).

The delay times depend upon capacitances and inductances of the bonding wires 105 and 106. Herein, capacitances depend upon dielectric constants of peripheral materials (including the resins 107a and 107b) and wiring areas of the bonding wires 105 and 106, while inductances depend upon the lengths of the bonding wires 105 and 106. It is possible to adjust the delay times occurring in the substrate 102 by changing the wiring lengths and the wiring areas.

In the DDP, however, it is necessary to adjust delay times caused by differences of lengths of the bonding wires 105 and 106 (which connect the semiconductor chips 103 and 104 to the substrate 102) in addition to the adjustment of delay times occurring in the substrate 102. This is because the ratio of the bonding wires 105 and 106 within the overall signal transmission path is relatively high in the DDP; hence, it is not possible to neglect delay times due to the bonding wires 105 and 106.

It is presumed that delay times due to the bonding wires 105 and 106 can be adjusted by changing the lengths and diameters of the bonding wires 105 and 106. However, it is difficult to change the lengths of the bonding wires 105 and 106. In addition, changing the diameters of the bonding wires 105 and 106 will likely cause negative influences to the reliability in connecting the semiconductor chips 103 and 104 to the substrate 102. Even when the lengths and diameters are changed, it is difficult to secure significant effects in adjusting delay times due to differences of lengths of the bonding wires 105 and 106.

To cope with the above drawback, various technologies have been developed and disclosed in various documents such as Patent Documents 1 to 3, which teach semiconductor devices capable of avoiding deterioration of signals by coating bonding wires with resins.

Patent Document 1: Japanese Unexamined Patent Application Publication No. 2004-259769

Patent Document 2: Japanese Unexamined Patent Application Publication No. S61-237455

Patent Document 3: Japanese Unexamined Patent Application Publication No. 2005-167160

Patent Document 1 teaches a semiconductor device in which the surrounding area of the bonding wires for connecting wire conductors to semiconductor elements is coated with a resin whose dielectric constant is approximately identical to the dielectric constant of a substrate.

Patent Document 2 teaches a semiconductor device having a first resin layer for sealing a semiconductor chip and a second resin layer formed externally of the first resin layer, wherein the dielectric constant of the first resin layer is lower than the dielectric constant of the second resin layer.

Patent Document 3 teaches a semiconductor device having a multilayered wiring structure including insulating layers and wiring layers which are alternately laminated on a substrate. Herein, in the "vertically adjacent" wiring layers, the resistance of a higher layer is identical to or lower than the resistance of a lower layer, and the resistance of the uppermost layer is lower than the resistance of the lowermost layer. In the "vertically adjacent" insulating layers, the dielectric constant of a higher layer is identical to or higher than the dielectric constant of a lower layer, and the dielectric constant of the uppermost layer is higher than the dielectric constant of the lowermost layer.

The semiconductor devices disclosed in Patent Document 1 and Patent Document 2 are designed to improve transmission characteristics such as high frequency characteristics, while the semiconductor device disclosed in Patent Document 3 is designed to reduce delay times due to the small thicknesses in the wiring layers in the multilayered refining structure.

The present inventors have recognized that none of the foregoing semiconductor devices are incapable of significantly reducing delay times due to differences of lengths of bonding wires.

SUMMARY

The invention seeks to solve the above problem, or to improve upon the problem at least in part.

In one embodiment, there is provided a semiconductor device that includes a substrate having a plurality of bumps on the backside thereof, a first semiconductor chip mounted on the surface of the substrate, a second semiconductor chip mounted on the first semiconductor chip above the surface of the substrate, a first bonding wire for connecting the first semiconductor chip to the substrate, a second bonding wire, whose length $L_2$ is longer than a length $L_1$ of the first bonding wire, for connecting the second semiconductor chip to the substrate, a first resin seal for sealing the first bonding wire, and a second resin seal for sealing the second bonding wire, wherein a dielectric constant $\in_1$ of the first resin seal is higher than a dielectric constant $\in_2$ of the second resin seal.

In the above, it is possible to adjust the delay time, which occurs when transmitting signals between the first semiconductor chip and the bump via the first bonding wire, and the delay time, which occurs when transmitting signals between the second semiconductor chip and the bump via the second bonding wire, wherein the difference between the delay times can be reduced. In addition, it is possible to increase timing margins for inputting and output signals in the semiconductor device.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

The drawings are used to explain semiconductor devices according to various embodiments of the present invention; hence, shapes, thicknesses, and dimensions of parts of semiconductor devices do not necessarily match those of actually produced semiconductor devices.

1. First Embodiment

Figure 1:
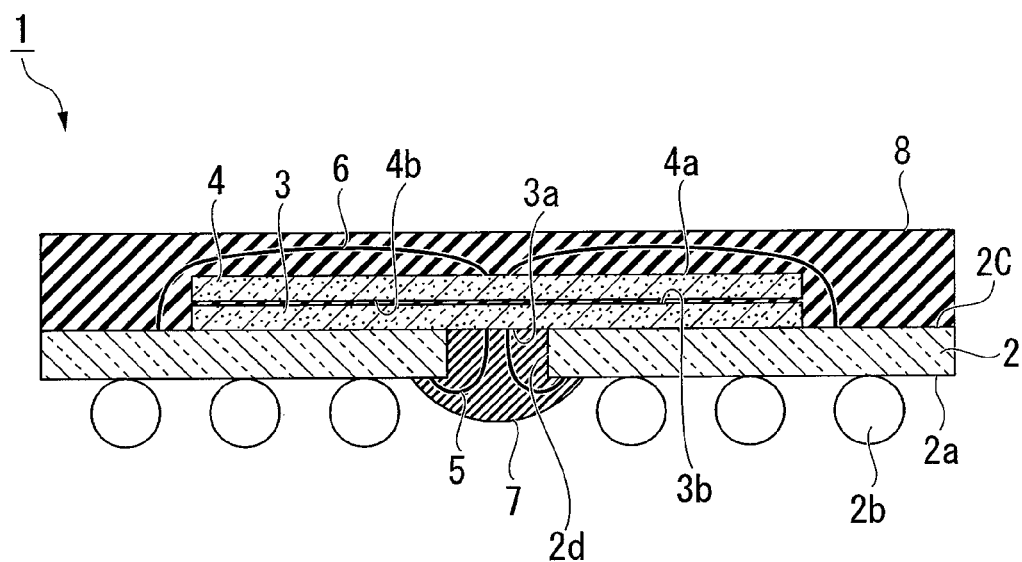
FIG. 1 is a cross-sectional view of a semiconductor device according to a first embodiment of the present invention.

FIG. 1 is a cross-sectional view of a semiconductor device 1 according to a first embodiment of the present invention.

The semiconductor device of FIG. 1 is constituted of a substrate 2 having a plurality of bumps 2b on a backside 2a, a first semiconductor chip 3 mounted on a surface 2c of the substrate 2, a second semiconductor chip 4 mounted on the first semiconductor chip 3 opposite to the surface 2c of the substrate 2, a plurality of first bonding wires 5 for connecting the first semiconductor chip 3 to the substrate 2, a plurality of second bonding wires 6, which are longer than the first bonding wires 5, for connecting the second semiconductor chip 4 to the substrate 2, a first resin seal 7 for sealing the first bonding wires 5, and a second resin seal 8 for sealing the second bonding wires 6.

In the semiconductor device 1, the first and second semiconductor chips 3 and 4 are connected to the circuitry (not shown) fabricated in the substrate 2 via the first and second bonding wires 5 and 6. Thus, the semiconductor device 1 is capable of inputting and outputting signals with an external device (not shown) via the bumps 2b conducting to the circuitry of the substrate 2.

The structure of the substrate 2 is not necessarily limited to specific types of substrates, but it is possible to use printed-wiring substrates such as high-density multilayered wiring substrates. The bumps 2b used for inputting and outputting signals are aligned on the backside 2a of the substrate 2. That is, the first and second semiconductor chips 3 and 4 are mounted on the surface 2c which is opposite to the backside 2a of the substrate 2. The circuitry is formed on the surface 2a and the backside 2c respectively so as to conduct to the bumps 2b. An opening 2d is formed at an approximately center position of the substrate 2 so as to run through the substrate 2 in its thickness direction between the surface 2c and the backside 2a. The opening 2d allows the first bonding wires 5 to be extended from the first semiconductor chip 3 to the backside 2a of the substrate 2.

In this connection, the substrate 2 is fabricated to adjust delay times in advance by appropriately changing the dielectric constant thereof and the wiring drawing pattern.

The first semiconductor chip 3 is mounted on the surface 2c in a face-down manner in which a surface 3a having electrodes (or pads) thereof is positioned opposite to the surface 2c of the substrate 2. Specifically, the first semiconductor chip 3 is mounted on the surface 2c such that the electrodes thereof are collectively positioned just above the opening 2d of the substrate 2. This makes it possible to draw wiring between the electrodes of the first semiconductor chip 3 and the backside 2a of the substrate 2.

The second semiconductor chip 4 is mounted on a backside 3b of the first semiconductor chip 3 whose surface 3a is mounted on the surface 2c of the substrate 2 in a face-up manner. Specifically, electrodes (or pads) are formed on a surface 4a of the second semiconductor chip 4, while a backside 4b of the second semiconductor chip 4 faces the backside 3b of the first semiconductor chip 3. This makes it possible to draw wiring between the electrodes of the second semiconductor chip 4 and the surface 2c of the substrate 2.

The first and second bonding wires 5 and 6 are electric wires made of metals. In consideration of metallic characteristics such as pressurized bonding properties, gold is frequently used for the first and second bonding wires 5 and 6;

but this is not a restriction; hence, it is possible to use other metals such as copper and aluminum.

First ends of the first bonding wires 5 are bonded to the electrodes collectively formed on the center area of the surface 3a of the first semiconductor chip, while second ends are drawn out of the opening 2d of the substrate 2 towards the backside 2a having the bumps 2b so that they are bonded to the wiring (not shown) formed on the backside 2a of the substrate 2.

First ends of the second bonding wires 6 are bonded to the electrodes collectively formed on the center area of the surface 4a of the second semiconductor chip 4 mounted on the backside 3b of the first semiconductor chip 3, while second ends are extended from the center area of the surface 4a of the second semiconductor chip 4 towards the wiring (not shown) formed on the surface 2c of the substrate 2.

The above makes it possible for the first and second semiconductor chips 3 and 4 to input and output signals with an external device (not shown) via the first and second bonding wires 5 and 6, and the bumps 2b.

The first embodiment is characterized in that a length $L_2$ of each second bonding wire 6 is longer than a length $L_1$ of each first bonding wire 5.

The first resin seal 7 is a resin mold for protecting the first bonding wires 5 and is filled in a space defined by the opening 2d of the substrate 2 and the surface 3a (having the electrodes) of the first semiconductor chip 3. The first resin seal 7 is expanded out of the opening 2d so as to completely seal the first bonding wires 5 which are extended on the backside 2a of the substrate 2.

The second resin seal 8 is a resin mold for protecting the first and second semiconductor chips 3 and 4 and the second bonding wires 6 and is formed to seal the first and second semiconductor chips 3 and 4 and the second bonding wires 6 above the surface 2c of the substrate 2.

The first embodiment is characterized in that the first and second resin seals 7 and 8 have different properties. That is, a dielectric constant $\in_1$ of the first resin seal 7 is higher than a dielectric constant $\in_2$ of the second resin seal 8, wherein it is preferable to set the dielectric constant $\in_1$ in accordance with equation (1).

$$\varepsilon_1 = \varepsilon_2 \left(\frac{L_2}{L_1}\right)^2 \qquad (1)$$

That is, when the length $L_2$ is four-times longer than the length $L_1$, the dielectric constant $\in_1$ is sixteen-times higher than the dielectric constant $\in_2$.

In this connection, high-dielectric organic materials whose dielectric constants reach "10" are presently sold on the market. The present research has found other dielectric materials whose dielectric constants reach "100". By mixing metal powder with resin, it is possible to further increase dielectric constants.

Next, delay times derived from the semiconductor device 1 of the first embodiment will be described in detail.

Since the semiconductor device 1 is designed to adjust delay times in advance by appropriately designing the substrate 2, it is presumed that the differences of delay times derived from the first and second semiconductor chips 3 and 4 substantially depend upon the differences of lengths of the first and second bonding wires 5 and 6. Assuming that the dielectric constant $\in_1$ is identical to the dielectric constant $\in_2$ while the length $L_2$ is four-time longer than the length $L_1$, the delay time of a signal transmitted through the second bonding wire 6 becomes four times longer than the delay time of a signal transmitted through the first bonding wire 5 because the delay times depend upon the lengths of the wires.

The first embodiment is designed based on equation (1) which defines the dielectric constant $\in_1$ as sixteen-times longer than the dielectric constant $\in_2$ when the length $L_2$ is four-times longer than the length $L_1$.

Specifically, a delay time $T_1$ occurs in transmitting a signal through the first bonding wire 5 of the unit length, while a delay time $T_2$ occurs in transmitting a signal through the second bonding wire 6 of the unit length. Each of the delay times $T_1$ and $T_2$ (which are represented by $T_{DELAY}$) is calculated in accordance with equation (2) using a dielectric constant $\in_r$ representing each of the dielectric constants $\in_1$ and $\in_2$.

$$T_{DELAY} = \frac{\sqrt{\varepsilon_r}}{C_0} \qquad (2)$$

In equation (2), $T_{DELAY}$ denotes the delay time occurring in the unit length; $\in_r$ denotes the dielectric constant; and $C_0$ denotes the speed of light.

That is, the delay times $T_1$ and $T_2$ occurring in transmission of signals in the unit length depend upon the square roots of the dielectric constants $\in_1$ and $\in_2$. Since the first embodiment is designed based on equation (1) such that the dielectric constant $\in_1$ is sixteen-times higher than the dielectric constant $\in_2$ when the length $L_2$ is four-time longer than the length $L_1$, the delay time $T_1$ of the first bonding wire 5 is four-times longer than the delay time $T_2$ of the second bonding wire 6. In other words, the delay time $T_1$ applied to the first bonding wire 5 is increased by a factor of "4" compared with the delay time which presumably occurs in the first bonding wire 5 when the dielectric constant $\in_1$ is identical to the dielectric constant $\in_2$.

When the semiconductor device 1 is designed such that the length $L_2$ is four-times longer than the length $L_1$, and the delay time $T_1$ applied to the first bonding wire 5 is four times longer than the delay time $T_2$ applied to the second bonding wire 6, the same delay time is set to the entire lengths of the first and second bonding wires 5 and 6.

As described above, the first embodiment is characterized in that the length $L_2$ of the second bonding wire 6 is longer than the length $L_1$ of the first bonding wire 5, and the dielectric constant $\in_1$ of the first resin seal 7 is higher than the dielectric constant $\in_2$ of the second resin seal 8. This makes it possible to appropriately adjust the delay time actually occurring in the transmission of signals between the first semiconductor chip 3 and the bump 2b via the first bonding wire 5 and the delay time actually occurring in the transmission of signals between the second semiconductor chip 4 and the bump 2b via the second bonding wire 6. In short, it is possible to achieve a relatively large timing margin for inputting and outputting signals in the semiconductor device 1.

Since the semiconductor device 1 of the first embodiment is designed such that the dielectric constant $\in 1$ of the first resin seal 7 is determined based on equation (1), it is possible to set the same delay time with respect to the transmission of signals between the first semiconductor chip 3 and the bump 2b via the first bonding wire 5 and the transmission of signals between the second semiconductor chip 6 and the bump 2b via the second bonding wire 6. This increases the timing margin for inputting and outputting signals in the semiconductor device 1, which is thus capable of precisely operating without operational error.

2. Second Embodiment

Figure 2:
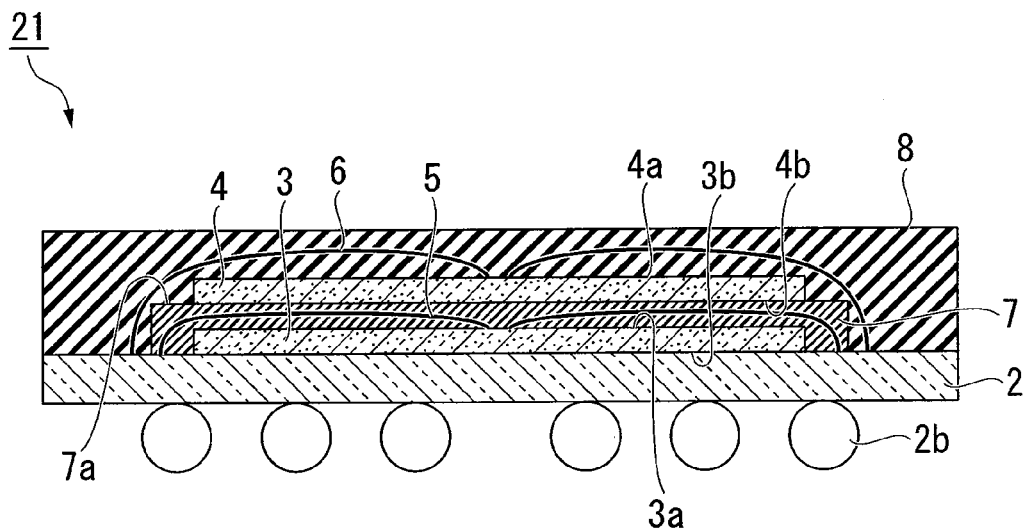
FIG. 2 is a cross-sectional view of a semiconductor device according to a second embodiment of the present invention.

FIG. 2 is a cross-sectional view of a semiconductor device 21 according to a second embodiment of the present invention, wherein parts identical to those of the semiconductor device 1 shown in FIG. 1 are designated by the same reference numerals; hence, duplicate descriptions thereof are avoided or simplified.

In the semiconductor device 21 of FIG. 2, the first semiconductor chip 3 is mounted on the surface 2c of the substrate 2 opposite to the backside 2a having the bumps 2b, whereas the second embodiment differs from the first embodiment in that the backside 3b of the first semiconductor chip 3 opposite to the surface 3a having the electrodes (or pads) faces the surface 2c of the substrate 2. Herein, the first ends of the first bonding wires 5 are connected to the electrodes formed on the surface 3a of the first semiconductor chip 3, while the second ends thereof are connected to the circuitry (not shown) formed on the surface 2c of the substrate.

The first resin seal 7 is formed on the surface 2c of the substrate 2 so as to completely seal the first semiconductor chip 3 and the first bonding wires 5 therein. The second semiconductor chip 4 is mounted on a surface 7a of the first resin seal 7 which is opposite to the surface 2c of the substrate 2. The electrodes (or pads) formed on the surface 4a of the second semiconductor chip 4 are connected to the circuitry formed on the surface 2c of the substrate 2 via the second bonding wires 6. The second resin seal 8 is formed on the surface 2c of the substrate 2 so as to completely seal the second semiconductor chip 4, the second bonding wires 6, and the first resin seal 7 therein.

Similar to the semiconductor device 1 of the first embodiment, the second semiconductor device 21 of the second embodiment is designed such that the length $L_2$ of the second boding wire 6 is longer than the length $L_1$ of the first bonding wire 5. That is, the semiconductor device 21 is designed to satisfy the relationship of equation (1) between the dielectric constant $\in_1$ of the first resin seal 7, the dielectric constant $\in_2$ of the second resin seal 8, the length $L_1$ of the first bonding wire 5, and the length $L_2$ of the second bonding wire 6.

In short, the semiconductor device 21 of the second embodiment can demonstrate the same effects as the semiconductor device 1 of the first embodiment.

3. Third Embodiment

Figure 3A:
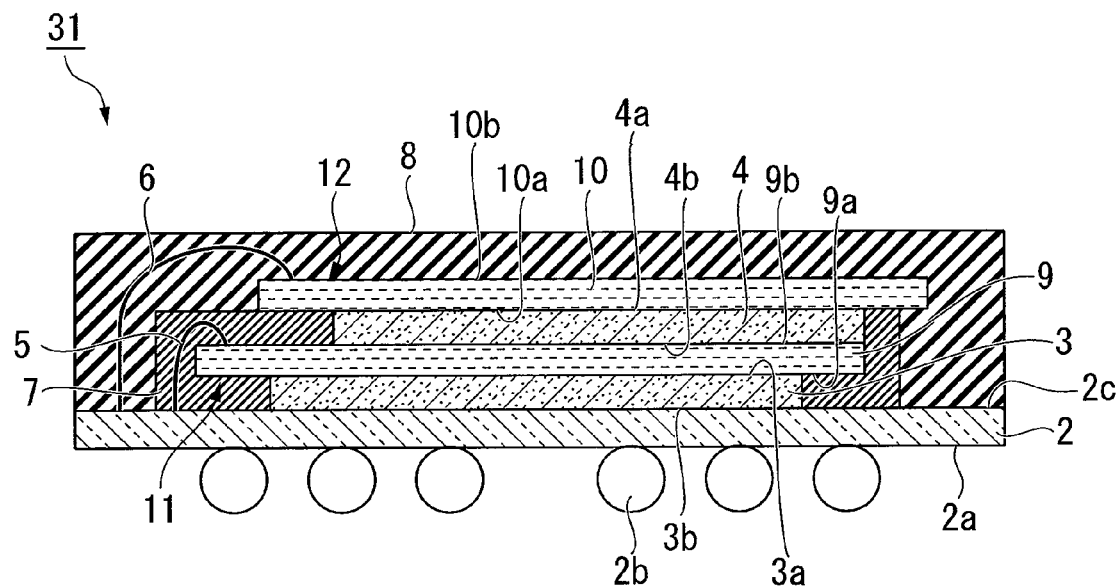
FIG. 3A and FIG. 3B are a cross-sectional view of a semiconductor device according to a third embodiment of the present invention.
Figure 3B:
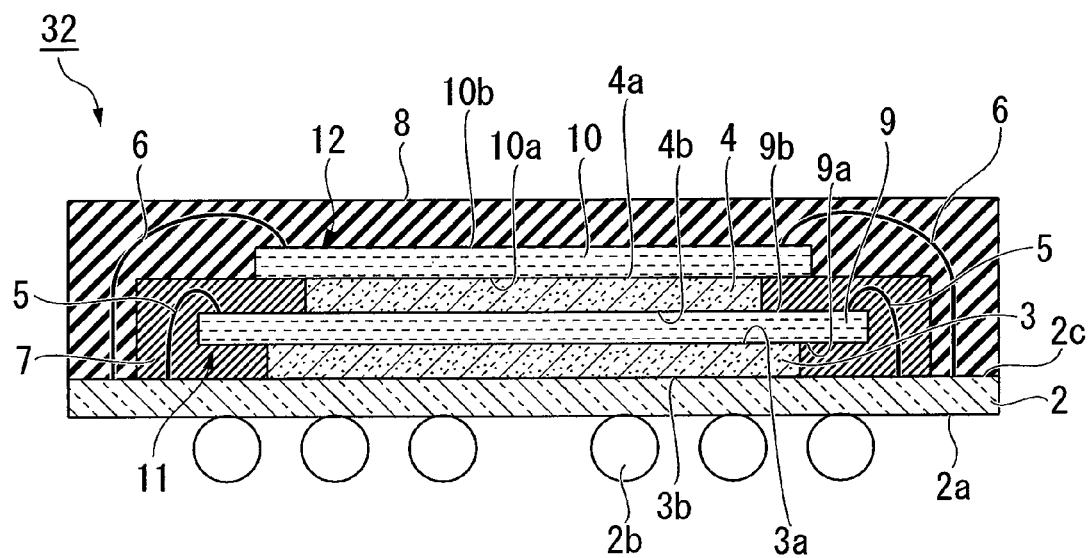

FIGS. 3A and 3B are cross-sectional views showing semiconductor devices 31 and 32 in accordance with a third embodiment of the present invention, wherein parts identical to those of the semiconductor devices 1 and 21 are designated by the same reference numerals; hence, duplicate descriptions thereof are avoided or simplified.

In the semiconductor device 31 of FIG. 3A, a package 11, which includes a substrate 9 and the first semiconductor chip 3, is mounted on the surface 2c of the substrate 2 opposite to the backside 2a having the bumps 2b. The package 11 is designed to adjust delay times occurring therein in advance, wherein the substrate 9 is connected with the first semiconductor chip 3 in a face-down manner in which a surface 9a thereof is directed downwardly in contact with the surface 3a of the first semiconductor chip 3. The package 11 is mounted on the surface 2c of the substrate 2 in such a way that the backside 3b of the first semiconductor chip 3 faces the surface 2c of the substrate 2. The package 11 is designed such that signals of the first semiconductor chip 3 are extracted by the wiring (not shown) which is formed on a backside 9b of the substrate 9 and is connected to the wiring formed on the surface 2c of the substrate 2 via the first bonding wire 5. In contrast to the semiconductor device 31 in which the first bonding wire 5 is connected to one side of the package 11, the semiconductor device 32 of FIG. 3B is designed such that the first bonding wires 5 are connected to two sides of the package 11.

The first resin seal 7 is formed on the surface 2c of the substrate 2 so as to completely seal the first bonding wire 5 and the package 11 therein. Before hardening of the first resin seal 7, a package 12 including a substrate 10 and the second semiconductor chip 4 is mounted on the backside 9b of the substrate 9 included in the package 11. Similar to the package 11, the package 12 is designed to adjust delay times occurring therein in advance, wherein the substrate 10 is connected with the second semiconductor chip 4 in a face-down manner in which a surface 10a thereof is directed downwardly in contact with the surface 4a of the second semiconductor chip 4. The package 12 is mounted on the first package 11 in such a way that the backside 4b of the second semiconductor chip 4 faces the backside 9b of the substrate 9. After installation of the package 12 on the package 11, the first resin seal 7 is hardened.

Signals of the second semiconductor chip 4 are extracted via the wiring formed on a backside 10b of the substrate 10, which is connected to the wiring formed on the surface 2c of the substrate 2 via the second bonding wire 6. The second resin seal 8 is formed on the surface 2c of the substrate 2 so as to completely seal the first resin seal 7, the package 11, and the second bonding wire 6. In contrast to the semiconductor device 31 in which the second bonding wire 6 is connected to one side of the package 12, the semiconductor device 32 of FIG. 3B is designed such that the second bonding wires 6 are connected to two sides of the package 12.

Similar to the semiconductor device 1 of the first embodiment, the semiconductor devices 31 and 32 according to the third embodiment are each designed such that the length $L_2$ of the second bonding wire 6 is longer than the length $L_1$ of the first bonding wire 5. That is, they are each designed to satisfy the relationship of equation (1) between the dielectric constant $\in_1$ of the first resin seal 7, the dielectric constant $\in_2$ of the second resin seal 8, the length $L_1$ of the first bonding wire 5, and the length $L_2$ of the second bonding wire 6.

In short, the semiconductor devices 31 and 32 of the third embodiment can demonstrate the same effects as the semiconductor device 1 of the first embodiment.

4. Fourth Embodiment

Figure 4:
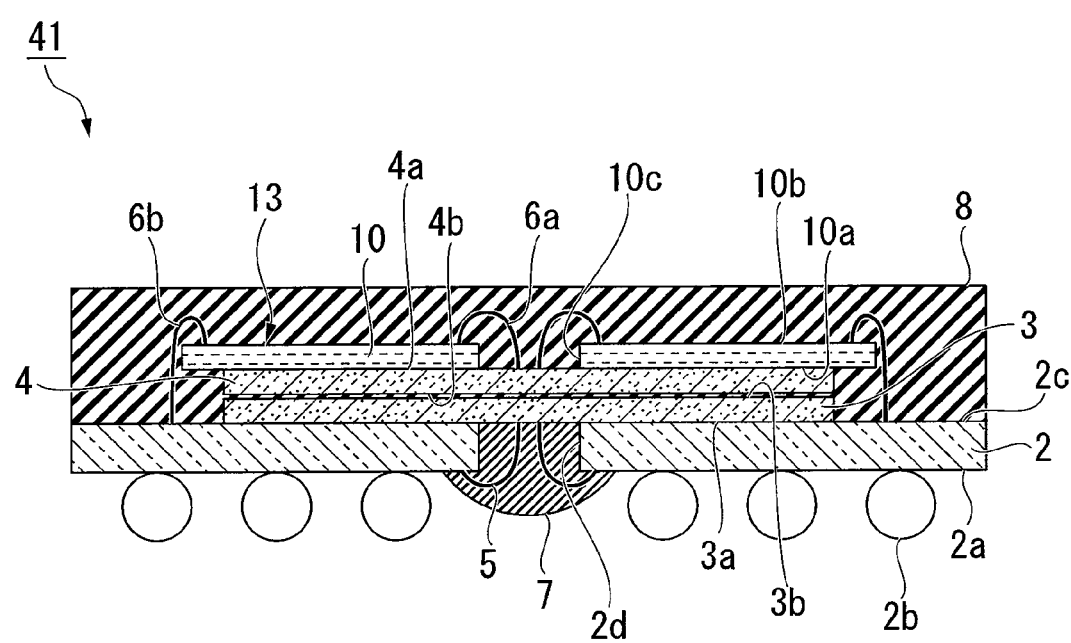
FIG. 4 is a cross-sectional view of a semiconductor device according to a fourth embodiment of the present invention.
Figure 5A:
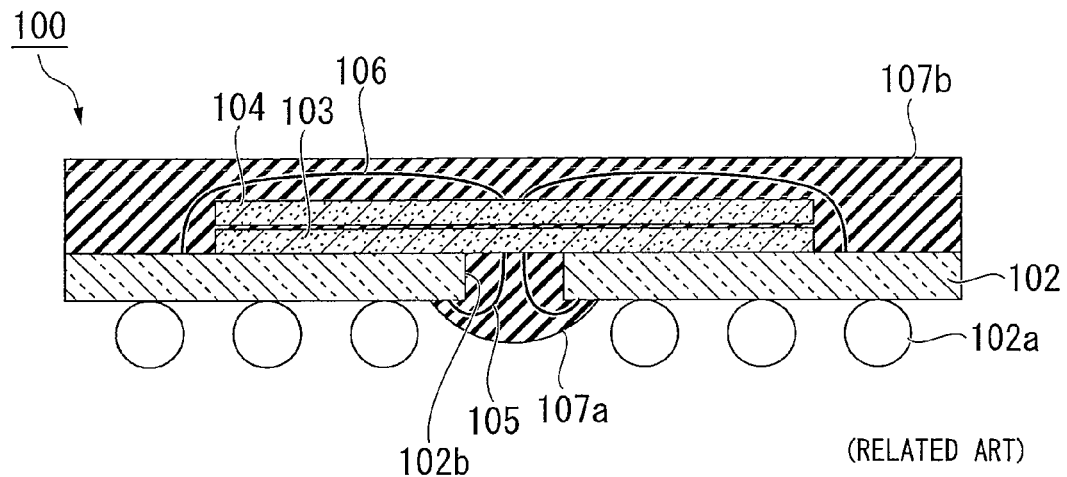
FIG. 5A is a sectional view showing one example of a semiconductor device including two semiconductor chips which are laminated together on a substrate with bonding wires of different lengths.
Figure 5B:
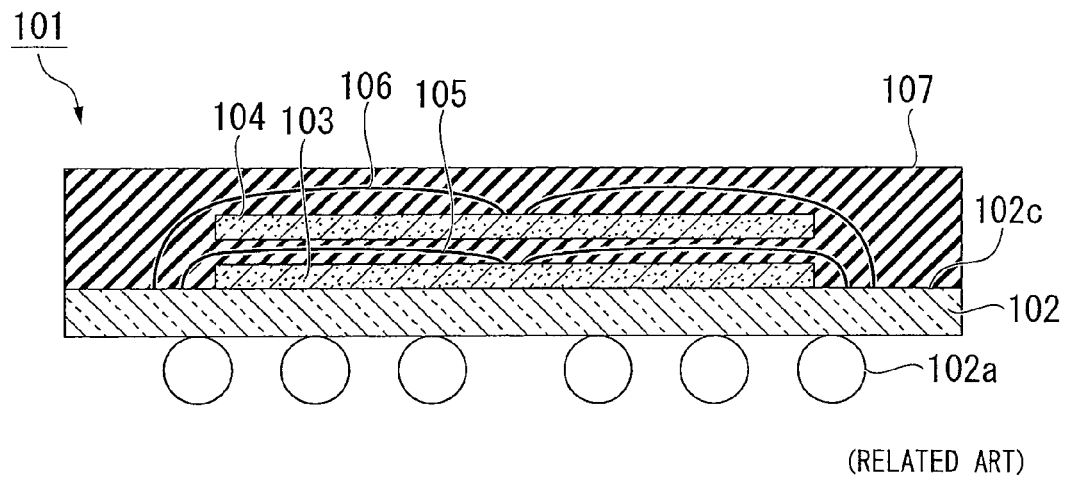
FIG. 5B is a sectional view showing another example of a semiconductor device including two semiconductor chips which are laminated together on a substrate with bonding wires of different lengths.

FIG. 4 is a cross-sectional view of a semiconductor device 41 according to a fourth embodiment of the present invention, wherein parts identical to those of the above semiconductor devices 1, 21, 31, and 32 are designated by the same reference numerals; hence, duplicate descriptions thereof are avoided or simplified.

The semiconductor device 41 of FIG. 4 is basically designed in a similar manner to the semiconductor device 1 of FIG. 1 such that the first semiconductor chip 3 is mounted on the surface 2c of the substrate 2, and the first resin seal 7 is formed to seal the first bonding wires 5 which are connected between the surface 3a and the backside 2a via the opening 2d of the substrate 2.

A package 13 including the second semiconductor chip 4 and the substrate 10 is mounted on the backside 3b of the first semiconductor chip 3. The package 13 is designed to adjust delay times occurring therein in advance, wherein the substrate 10 is connected with the second semiconductor chip 4 in a face-down manner in which the backside 10a thereof is directed downwardly in contact with the surface 4a of the second semiconductor chip 4. In addition, a plurality of second bonding wires 6a is wired to electrically connect the second semiconductor chip 4 to the substrate 10, wherein first ends of the second binding wires 6a are connected to the electrodes formed on the surface 4a of the second semiconductor chip 4, while second ends thereof are extended from an opening 10c, which runs through the center portion of the substrate 10, and are connected to the wiring (not shown) formed on the backside 10b of the substrate 10 in proximity to the opening 10c. That is, the package 13 is designed to transmit signals between the second semiconductor chip 4 and the backside 10b of the substrate 10 via the second bonding wires 6a.

The package 13 is mounted on the first semiconductor chip 3 in such a way that the backside 4b of the second semiconductor chip 4 faces the backside 3b of the first semiconductor chip 3. Signals of the second semiconductor chip 4 can be extracted from the wiring (not shown) formed in the periphery of the backside 10b of the substrate 10, which is electrically connected to the wiring formed on the surface 2c of the substrate 2 via a plurality of second bonding wires 6b.

As shown in FIG. 4, the second resin seal 8 is formed on the surface 2c of the substrate 2 so as to completely seal the first semiconductor chip 3, the package 13, and the second bonding wires 6a and 6b.

Since the semiconductor device 41 of the fourth embodiment includes two types of the second bonding wires 6a and 6b, the above length $L_2$ of the second bonding wire 6 is defined as the sum of the lengths of the second bonding wires 6a and 6b.

Similar to the semiconductor device 1 of the first embodiment, the semiconductor device 41 of the fourth embodiment is designed such that the length $L_2$ of the second bonding wire 6 is longer than the length $L_1$ of the first bonding wire 5. That is, the semiconductor device 41 is designed to satisfy the relationship of equation (1) between the dielectric constant $\in_1$ of the first resin seal 7, the dielectric constant $\in_2$ of the second resin seal 8, the length $L_1$ of the first bonding wire 5, and the length $L_2$ of the second bonding wire 6.

In short, the semiconductor device 41 of the fourth embodiment can demonstrate the same effects as the semiconductor device 1 of the first embodiment.

As described above, all the semiconductor devices 1, 21, 31, 32, and 41 are designed such that multiple semiconductor chips are laminated together, connected to the substrate 2 by way of wire bonding, and sealed with resins, wherein it is possible to reduce differences of delay times occurring in semiconductor chips, and it is possible to increase timing margins for inputting and outputting signals with respect to semiconductor chips.

5. Industrial Applicability

The present invention is applicable to mobile devices such as cellular phones and digital domestic appliances such as HDD recorders and DVD players, which require high-density packaging of semiconductor devices.

Lastly, it is apparent that the present invention is not limited to the above embodiments, but may be modified and changed without departing from the scope and spirit of the invention.

What is claimed is:

1. A semiconductor device comprising:
a substrate including a front surface and a back surface opposite to the front surface;
a plurality of bumps formed on the back surface of the substrate;
a first semiconductor chip including a first surface, a second surface opposite to the first surface, and a first electrode formed on the first surface, and mounted over the front surface of the substrate such that the second surface of the first semiconductor chip faces the front surface of the substrate;
a first bonding wire electrically connecting the first electrode of the first semiconductor chip with an associated one of the bumps;
a first resin seal covering the first bonding wire;
a second semiconductor chip including a third surface, a fourth surface opposite to the third surface, and a second electrode formed on the third surface, and mounted over the first semiconductor chip such that the fourth surface of the second semiconductor chip faces the first surface of the first semiconductor chip, the first resin seal being interposed between the first semiconductor chip and the second semiconductor chip;
a second bonding wire electrically connecting the second electrode of the second semiconductor chip with an associated one of the bumps; and
a second resin seal formed on the front surface of the substrate, and covering the first semiconductor chip, the first resin seal, the first semiconductor chip, the second semiconductor chip, and the second wire,
wherein a dielectric constant of the first resin seal is higher than a dielectric constant of the second resin seal.

2. The semiconductor device according to claim 1, wherein a length of the second bonding wire is longer than a length of the first bonding wire.

3. The semiconductor device according to claim 1, wherein the first resin seal is formed on the front surface of the substrate so as to completely cover the first semiconductor chip and the first bonding wire therein.

4. The semiconductor device according to claim 1, wherein the first electrode is arranged at a center area of the first surface of the first semiconductor chip, and wherein the second electrode is arranged at a center area of the third surface of the second semiconductor chip.

5. A semiconductor device comprising:
a circuit board including a front surface, a back surface, a plurality of first and second bonding electrodes formed on the front surface, and a plurality of bump electrodes formed on the back surface;
a first semiconductor chip including a first main surface, a second main surface, and a plurality of first chip electrodes formed on the first main surface, the first semiconductor chip being mounted at the second main surface on the front surface of the circuit board;
a second semiconductor chip including a third main surface, a fourth main surface, and a plurality of second chip electrodes formed on the third main surface;
a first resin layer interposed between the first main surface of the first semiconductor chip and the fourth main surface of the second semiconductor chip such that the second semiconductor chip is mounted on the first semiconductor chip;
a second resin layer formed to cover the third main surface of the second semiconductor chip, wherein a dielectric constant of the first resin layer is higher than a dielectric constant of the second resin layer;
a plurality of first wires each including one end portion bonded to an associated one of the second chip electrodes of the second semiconductor chip, running through the second resin layer, and further including the other end portion bonded to an associated one of the second bonding electrodes of the circuit board, and
a plurality of second wires each including one end portion bonded to an associated one of the first chip electrodes of the first semiconductor chip, running through the first resin layer, and further including the other end portion bonded to an associated one of the first bonding electrodes of the circuit board.

6. The semiconductor device according to claim 5, wherein each of the second wires is shorter than each of the first wires.

7. The semiconductor device according to claim 5, wherein the other end portion of each of the second wires is included in the first resin layer, and wherein the other end portion of each of the first wires is included in the second resin layer.

* * * * *